(12) United States Patent
Chao

(10) Patent No.: US 8,058,702 B2
(45) Date of Patent: Nov. 15, 2011

(54) PHASE CHANGE MEMORY CELL

(75) Inventor: Te-Sheng Chao, Taichung County (TW)

(73) Assignees: Nanya Technology Corporation, Taoyuan (TW); Winbond Electronics Corp., Taichung County (TW)

( * ) Notice: Subject to any disclaimer, the term of this patent is extended or adjusted under 35 U.S.C. 154(b) by 0 days.

(21) Appl. No.: 11/553,432

(22) Filed: Oct. 26, 2006

(65) Prior Publication Data
US 2007/0278538 A1 Dec. 6, 2007

(30) Foreign Application Priority Data
Jun. 2, 2006 (TW) ................................ 95119642 A

(51) Int. Cl.
H01L 29/00 (2006.01)

(52) U.S. Cl. ........ 257/537; 257/209; 257/246; 257/248; 257/296; 257/298; 257/300; 257/529; 257/536; 257/903; 257/E21.661; 257/E21.662; 257/E21.68; 257/E27.006; 257/E27.098; 257/E31.029

(58) Field of Classification Search ........... 257/E31.029, 257/209, 246, 248, 296, 298, 300, 529, 536, 257/537, 903, E21.661, E21.662, E21.68, 257/E27.006, E27.098
See application file for complete search history.

(56) References Cited

U.S. PATENT DOCUMENTS

| 6,625,054 B2 | 9/2003 | Lowrey et al. |
| 6,809,401 B2 | 10/2004 | Nishihara et al. |
| 7,635,855 B2 * | 12/2009 | Chen et al. ................ 257/4 |
| 2005/0112896 A1 | 5/2005 | Hamann et al. |
| 2005/0130414 A1 | 6/2005 | Choi et al. |
| 2005/0285094 A1 * | 12/2005 | Lee et al. ................ 257/2 |
| 2006/0001164 A1 * | 1/2006 | Chang ................ 257/758 |
| 2006/0033094 A1 * | 2/2006 | Campbell ................ 257/4 |
| 2006/0071204 A1 * | 4/2006 | Happ ................ 257/3 |
| 2006/0076641 A1 | 4/2006 | Cho et al. |
| 2006/0077741 A1 * | 4/2006 | Wang et al. ................ 365/222 |
| 2006/0097239 A1 | 5/2006 | Hsiung |
| 2007/0187801 A1 * | 8/2007 | Asao et al. ................ 257/613 |

* cited by examiner

Primary Examiner — Jay C Kim

(57) ABSTRACT

A phase change memory cell is disclosed, including a first electrode and a second electrode, and a plurality of recording layers disposed between the first and second electrodes. The phase of an active region of each of the recording layers can be changed to a crystalline state or an amorphous state by current pulse control and hence respectively has crystalline resistance or amorphous resistance. At least two of the recording layers have different dimensions such that different combinations of the crystalline and amorphous resistance result in at least three different effective resistance values between the first and second electrodes. The phase change memory cell can be realized with the same material of the recording layers and thus can be fabricated with simple and currently developed CMOS fabrication process technologies. Furthermore, the phase change memory is easy to control due to large current programming intervals.

8 Claims, 12 Drawing Sheets

| State | Writing Current |
|---|---|
| 0 | $I_2 < I < I_3$ |
| 1 | $I_3 < I < I_4$ |
| 2 | $I_4 < I$ |

FIG. 7A

| State | 1st-stage Writing Current | 2st-stage Writing Current |
|---|---|---|
| 0 | $I_2 < I < I_3$ | $I_2 < I < I_3$ |
| 1 | $I_2 < I < I_3$ | $I_3 < I < I_4$ |
| 2 | $I_2 < I < I_3$ | $I_4 < I$ |

FIG. 7B

PHASE CHANGE MEMORY CELL

BACKGROUND OF THE INVENTION

1. Field of the Invention

The invention relates to a phase change memory, and in particular to a multilevel phase change memory.

2. Description of the Related Art

Phase change memories with competitive advantages of speed, low power consumption, high capacity, CMOS fabrication process compatibility and low costs, are suitable for use as high density stand-alone or embedded memories. Phase change memories are thus considered to have potentiality to replace currently commercial and competitive volatile memories such as SRAM and DRAM and non-volatile memories such as Flash. Bottlenecks in development of phase change memory mainly result from high writing current of the memory elements, since high writing current dictates increased area of connected driving transistors, leading to large memory cell area and low memory density. One method of increasing the phase change memory density is to decrease contact area between heater electrode and phase change recording layer so that the writing current can be reduced. However, this method is restricted by lithography and fabrication process technologies and thus harder to be implemented. Another method develops multilevel phase change memories with the same memory cells. However, this makes it difficult to control programming current and complicate process integration of various materials.

Multilevel phase change memories are proposed by Ovonyx in Elec_Memory_Research_Report in 1999, as shown in FIG. 1, by the relationship of memory state with writing current interval. Lateral axis represents writing current and vertical axis represents cell resistance resulting from the corresponding writing current. Different values of cell resistance are representative of different memory states. While an advantage of the multilevel operation can increase memory states, current programming intervals (1.42-1.51-1.51, 1.51-1.60, . . . , and 2.73-2.82 mA) corresponding to different memory states (or cell resistance) are extremely small and thus difficult to define and control, resulting in data storage errors. Additionally, resistance uniformity of respective states in different memory cells cannot be controlled precisely due to the possible deviation of fabrication process.

Japanese Matsushita Electronics Cooperation discloses another multilevel memory cell having various recording materials in U.S. Pat. No. 6,809,401. FIG. 2 is a cross section of a multilevel memory cell 200 disclosed therein. As shown, the multilevel phase change memory cell 200 comprises a substrate 21, a bottom electrode 22 and a top electrode 23, first to Nth recording layers $24_1$-$24_N$ of different materials, and first to (N-1)th interlayers $25_1$-$25_{N-1}$ respectively disposed between two adjacent recording layers $24_1$-$24_N$. Although the multilevel phase change memory cell 200 provides multilevel operation, different properties of the recording layers $24_1$-$24_N$ of different materials result in high control difficulty and fabrication process complexity.

Accordingly, a multilevel phase change memory cell having larger current programming intervals, recording layers of the same materials and simple fabrication process is called for.

BRIEF SUMMARY OF THE INVENTION

The invention provides a phase change memory cell providing multilevel operation to increase memory density, is realized using the same phase change material. The phase change memory cell also has large current programming intervals. Moreover, the phase change memory can be fabricated utilizing currently developed CMOS fabrication process technologies.

The invention provides a phase change memory cell comprising a first electrode and a second electrode, and a plurality of recording layers disposed between the first and second electrodes. The phase of an active region of each of the recording layers can be reversibly changed between crystalline and amorphous state which is determined by current pulse and hence respectively has crystalline resistance or amorphous resistance. At least two of the recording layers have different dimensions such as cross-sectional area and/or thickness so that different combinations of the crystalline and amorphous resistance result in at least three different effective resistance values between the first and second electrodes.

The invention provides another phase change memory cell comprising a first electrode and a second electrode, a plurality of recording layers disposed between the first and second electrodes, and a plurality of heating plugs each disposed between two of the recording layers or between one of the recording layers and one of the first and second electrodes. The phase of an active region of each of the recording layers can be reversibly changed between crystalline and amorphous state which is determined by current pulse and hence respectively has crystalline resistance or amorphous resistance. At least two of the contact areas between the recording layers and the heating plugs are different so that different combinations of the crystalline and amorphous resistance result in at least three different effective resistance values between the first and second electrodes.

The invention provides another phase change memory cell comprising a first electrode and a second electrode, a plurality of recording layers disposed between the first and second electrodes, a plurality of heating plugs each disposed between two of the recording layers or between one of the recording layers and one of the first and second electrodes, and at least one interlayer each connected between one of the recording layers and one of the heating plugs. The phase of an active region of each of the recording layers can be reversibly changed between crystalline and amorphous state which is determined by current pulse and hence respectively has crystalline resistance or amorphous resistance. The interlayer is disposed such that different combinations of the crystalline and amorphous resistance result in at least three different effective resistance values between the first and second electrodes.

In the phase change memory cells of the invention, the recording layers can be of the same material. Accordingly, properties of only one material need to be considered, and the fabrication process is thus very simple and can be realized by currently developed CMOS fabrication process technologies. Additionally, current programming intervals are larger and programming control in different memory states can thus be performed readily.

BRIEF DESCRIPTION OF THE DRAWINGS

The invention can be more fully understood by reading the subsequent detailed description and examples with references made to the accompanying drawings, wherein:

FIGS. 7A and 7B are relational tables of written states to writing current in accordance with two embodiments of the invention;

DETAILED DESCRIPTION OF THE INVENTION

Figure 1:
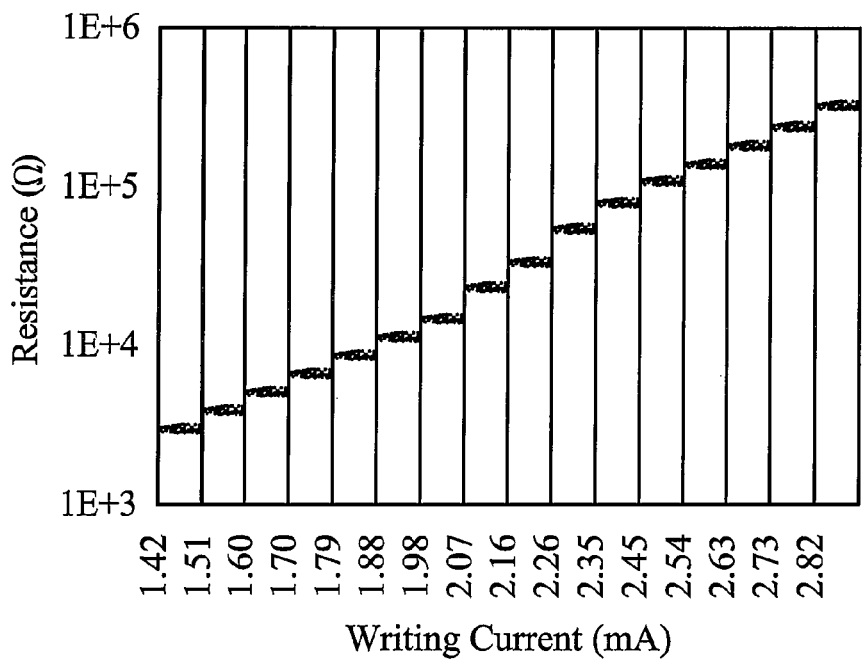
FIG. 1 shows the relationship between memory state and programming current interval in a conventional phase change memory cell.
Figure 2:
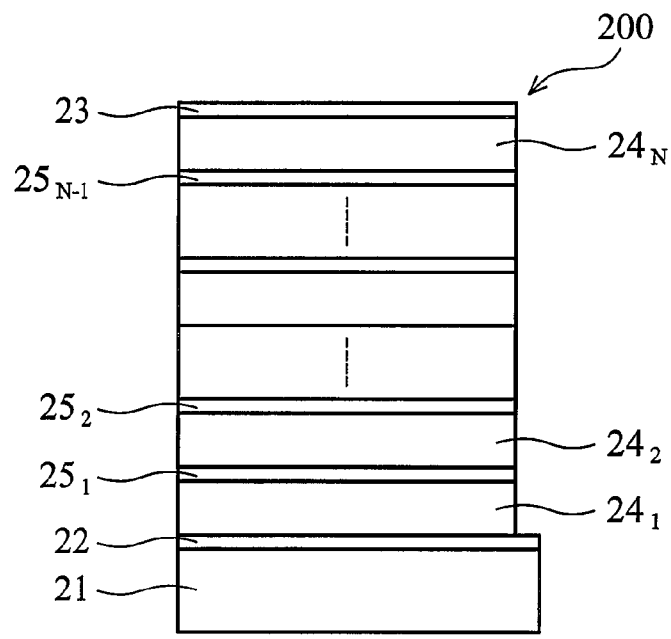
FIG. 2 is a cross section of another conventional multilevel memory cell.
Figure 3:
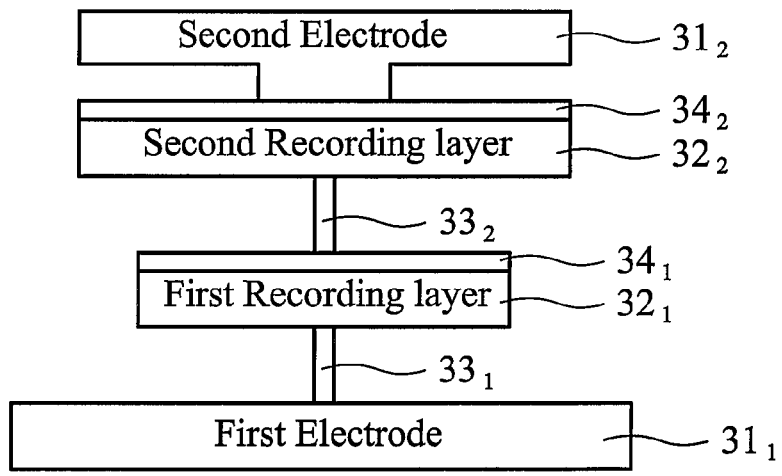
FIG. 3 is a cross section of a phase change memory cell in accordance with an embodiment of the invention.

FIG. 3 is a cross section of a phase change memory cell 300 in accordance with an embodiment of the invention. As shown, the phase change memory cell 300 comprises a first electrode $31_1$ and a second electrode $31_2$ such as a single metallic or alloy layer of Al, Au, Ag, Cu, Pt, Ti and W or other metallic compounds. Additionally, between the first and second electrode $31_1$ and $31_2$, from bottom to top, are disposed a first heating plug $33_1$, a first recording layer $32_1$, a first blocking layer $34_1$, a second heating plug $33_2$, a second recording layer $32_2$ and a second blocking layer $34_2$.

The first and second blocking layers $34_1$ and $34_2$ are, for example, single metallic or alloy layers of Al, Au, Ag, Cu, Pt, Ti and W or other metallic compounds, respectively blocking diffusion of atoms between the first recording layer $32_1$ and second heating plug $33_2$, and between the second recording layer $32_2$ and second electrode $31_2$. However, it is noted that when the materials of the first recording layer $32_1$ and second heating plug $33_2$ are chosen such that atoms therein will not diffuse to each other, the disposing of the first blocking layer $34_1$ is dispensable. Similarly, when the materials of the second recording layer $32_2$ and second electrode $31_2$ are chosen such that atoms therein will not diffuse to each other, the disposing of the second block layer $34_2$ is dispensable.

The materials of the first and second recording layers $32_1$ and $32_2$ are selected such that their phases of respective active regions therein can be reversible between crystalline and amorphous states when they receive corresponding electronic energy to cause temperature rising via Joule heating, resulting in a resistance transition between a lower value of the crystalline state and a higher value of the amorphous state. The materials of the first and second recording layers $32_1$ and $32_2$ can be S-based, Se-based or Sb-based alloy, for example, binary alloy such as GaSb, In Sb, InSe, $Sb_2Te3$ and GeTe, ternary alloy such as $Ge_2Sb_2T_5$, InSbTe, GaSeTe, $SnSbTe_4$ and InSbGe, or quaternary alloy such as AgInSbTe, (Ge, Sn)SbTe, GeSb(SeTe) and $Te_{81}Ge_{15}Sb_2S_2$.

As shown in FIG. 3, the top-view areas of the first and second recording layers $32_1$ and $32_2$ in the memory cell 300 are different and respectively denoted as PA1 and PA2, while the materials of the same can be the same or different. The different top-view areas of the first and second recording layers $32_1$ and $32_2$, for example, can be realized as different top-view diameters or edge lengths of the same. The embodiment shown comprises PA2 larger than PA1, but PA2 can also be smaller than PA1. In addition, the materials of the first and second recording layers $32_1$ and $32_2$ are the same in the embodiment to simplify the description.

Figure 4:
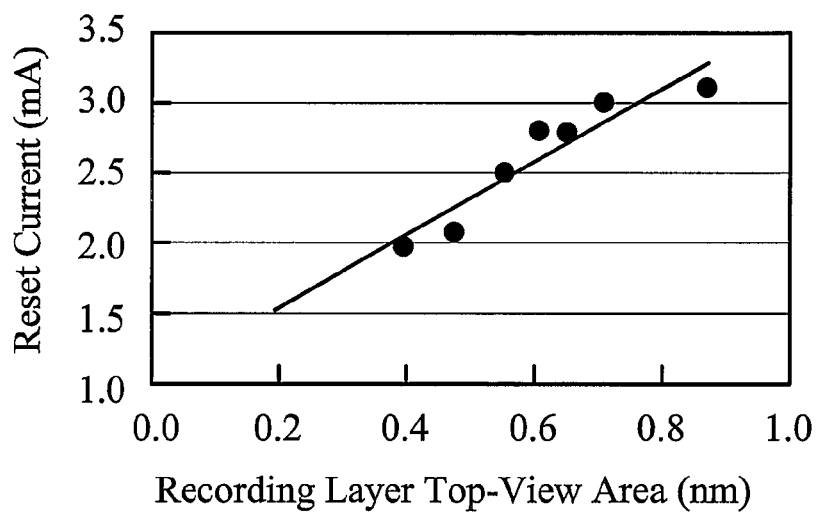
FIG. 4 shows the relationship between reset current and top-view area of a phase change recording layer.

FIG. 4 shows relationship between reset current and the top-view areas of a phase change recording layer proposed by Samsung corporation in IEDM 2003, illustrating programming mechanism of the phase change memory cell 300 of the invention, wherein the reset current is one to transfer the phase change material from crystalline state to amorphous state. As shown, phase change recording layers with different top-view areas have different magnitudes of reset currents. It can thus be seen that, even though the first and second recording layers $32_1$ and $32_2$ are the same material and fed with the same writing current, the active regions thereof can have different phases. As such, different information can be recorded using different effective resistance values generated by different phase combinations. This is achieved by adopting the adequate top-view areas for the first and second recording layers $32_1$ and $32_2$ so that different phase combinations are distinguishable, for example, by measuring the effective resistance value between the first and second electrodes $31_1$ and $31_2$.

Figure 5:
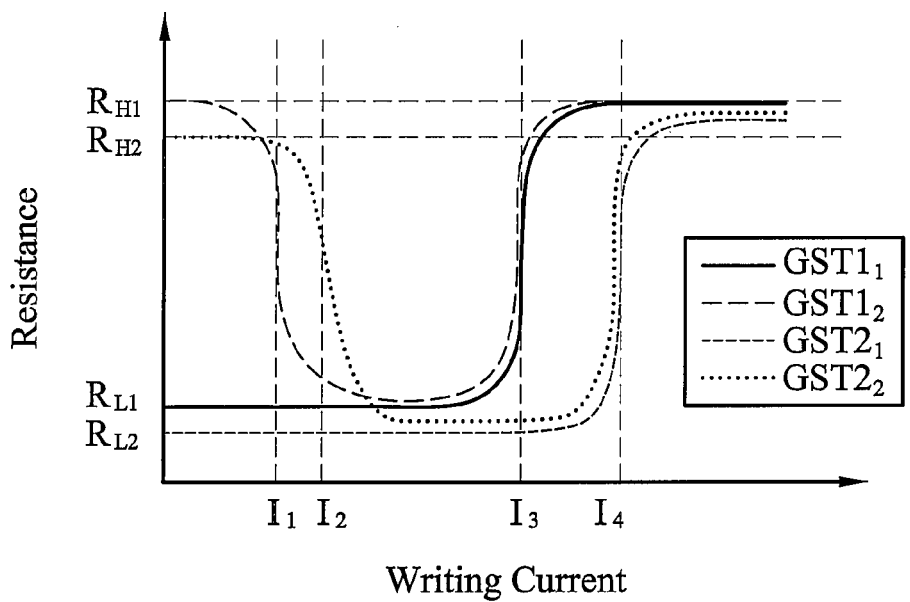
FIG. 5 shows respective programming curves for the first and second recording layers of FIG. 3, illustrating the relationship between resistance values and writing current.

FIG. 5 shows respective programming curves for the first and second recording layers $32_1$ and $32_2$ of FIG. 3, illustrating the relationship between resistance values and writing current. The lateral axis represents the writing current through the first or second recording layer $32_1$ or $32_2$ and the vertical axis represents the resulting resistance value of the same. The initial phase at the beginning of a write operation is determined by the previous writing state. In the figure, curves $GST1_1$ and $GST1_2$ respectively represent programming curves of the first recording layers $32_1$ with the initial phase in crystalline and amorphous states, and curves $GST2_1$ and $GST2_2$ respectively represent programming curves of the second recording layers $32_2$ with the initial phase in crystalline and amorphous states. The discussion is now made for the first recording layer $32_1$ first. If the first recording layer $32_1$ is initially in a crystalline state, as shown by the curve $GST1_1$, when the writing current falls below $I_3$, the first recording layer $32_1$ stays in the crystalline state and thus has a crystalline resistance value $R_{L1}$, however, when the writing current exceeds $I_3$, the active region of the first recording layer $32_1$ melts by Joule heating and then cools immediately to change to amorphous state and the first recording layer $32_1$ thus has an amorphous resistance value $R_{H1}$. Conversely, if the first recording layer $32_1$ is initially in an amorphous state, as shown by the curve $GST1_2$, when the writing current falls below $I_1$, since the thermal energy is insufficient to change the phase of the first recording layer $32_1$, the first recording layer $32_1$ stays in the amorphous state and thus has the amorphous resistance value $R_{H1}$; when the writing current falls beyond $I_1$ but below $I_3$, since the temperature of the active region of the first recording layer $32_1$ increases beyond the crystallization temperature by Joule heating, the active region goes through a nucleation and growth process to reach a crystalline state and thus has the crystalline resistance value $R_{L1}$; when the writing current is further increased to exceed $I_3$, the active region melts by Joule heating and then cools down immediately once more, consequently returning to the amorphous state and thus having the amorphous resistance value $R_{H1}$. The current $I_3$ is thus referred to as a reset current of the first recording layer $32_1$.

The second recording layer $32_2$ undergoes similar transition process. If the second recording layer $32_2$ is in a crystalline state initially, as shown by the curve $GST2_1$, when the writing current falls below $I_4$, the second recording layer $32_2$ stays in the crystalline state and thus has a crystalline resistance value $R_{L2}$; however, when the writing current exceeds $I_4$, the active region of the second recording layer $32_2$ transits from the crystalline state to an amorphous state and thus has an amorphous resistance value $R_{H2}$. Conversely, if the second recording layer $32_2$ is initially in an amorphous state, as shown by the curve $GST2_2$, when the writing current falls below $I_2$, since the thermal energy is insufficient to change the crystal structure of the second recording layer $32_2$, the second recording layer $32_2$ stays in the amorphous state and thus has the amorphous resistance value $R_{H2}$; when the writing current falls beyond I2 but below $I_4$, since the temperature of the active region of the second recording layer $32_2$ increases beyond the crystallization temperature by Joule heating, the active region goes through a nucleation and growth process to reach a crystalline state and thus has the crystalline resistance value $R_{L2}$; when the writing current is further increased to exceed $I_4$, the active region melts by Joule heating and then cools immediately once more, consequently returning to the amorphous state and thus having the amorphous resistance value $R_{H2}$. The current $I_4$ is thus referred to as a reset current of the second recording layer $32_2$.

As shown in FIG. 4, because the top-view area of the first recording layer $32_1$ is smaller than that of the second recording layer $32_2$, the reset current $I_3$ of the first recording layer $32_1$ is lower than the reset current $I_4$ of the second recording layer $32_2$.

Figure 6:
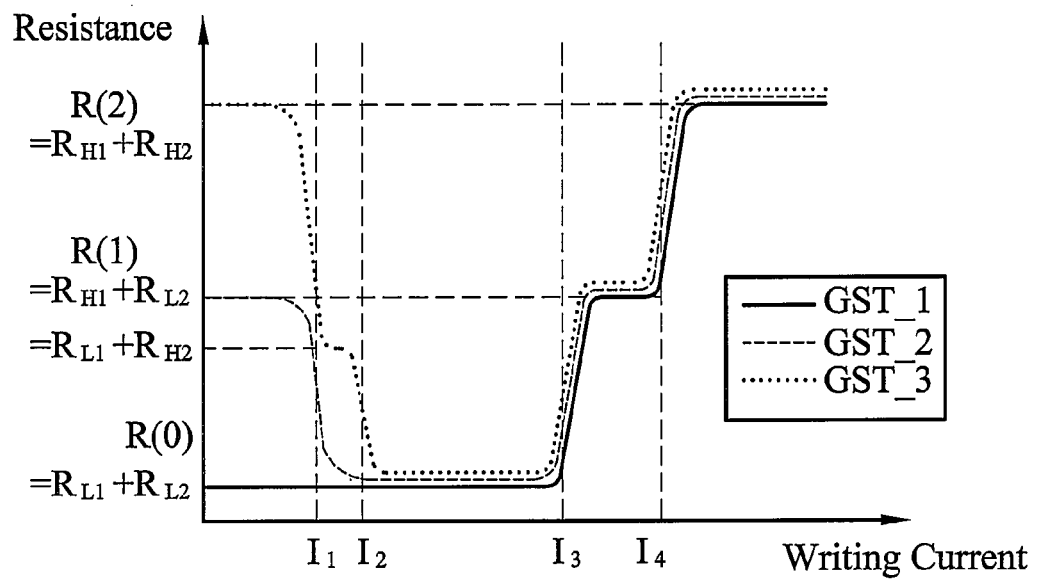
FIG. 6 shows programming curves for the phase change memory cell of FIG. 3, illustrating the relationship between resistance values and writing current.

FIG. 6 shows programming curves for the phase change memory cell 300 of FIG. 3, illustrating the relationship between resistance values and writing current. The lateral axis represents the writing current from the first recording layer $32_1$ to the second recording layer $32_2$ and the vertical axis represents the resulting effective resistance value between the first and second electrodes $31_1$ and $31_2$, which is substantially equal to series resistance of the first and second recording layers $32_1$ and $32_2$. Different programming curves correspond to different initial phase combinations of the first and second recording layers $32_1$ and $32_2$ dependent upon the previous writing state. In the figure, curves GST_1, GST_2 and GST_3 are respectively programming curves with the first and second recording layers $32_1$ and $32_2$ both in crystalline state (denoted as state 0), respectively in amorphous and crystalline states (denoted as state 1) and both in amorphous state (denoted as state 2) after the previous writing operation.

As shown in FIG. 6, programming curves GST_1-GST_3 differ greatly for the current below $I_2$ due to different initial states, so programming current below $I_2$ is not adequate to be used in write operations. Conversely, programming curves GST_1-GST_3 are almost the same for the current beyond $I_2$, that is, the effective resistance values are undistinguishable even with different initial states. For this reason, current beyond $I_2$ can be used in write operation. As shown, when the writing current is between $I_2$ and $I_3$, between $I_3$ and $I_4$, and beyond $I_4$, the phase change memory cell 300 is respectively in state 0, state 1, and state 2, having a corresponding resistance value $R(0)=R_{L1}+R_{L2}$, $R(1)=R_{H1}+R_{L2}$, and $R(2)=R_{H1}+R_{H2}$.

Accordingly, write operations are performed on the phase change memory cell 300 by feeding writing current through the first and second recording layers $32_1$ and $32_2$, wherein the magnitude of the writing current is determined according to which of the states 0-2 is to be written.

FIG. 7A is a relational table of written states to writing current in accordance with a first embodiment of the invention. When a writing operating is performed to achieve state 0, 1 or 2, the writing current I is respectively $I_2<I<I_3$, $I_3<I<I_4$ and $I_4<I$.

FIG. 7B is a relational table of written states to writing current in accordance with a second embodiment of the invention, differing from the first embodiment only in that, during any write operation, a first-stage write operation is first performed using a reset current between $I_2$ and $I_3$ to reset the cell to state 0, and a second-stage operation is then performed using a writing current dependent on the state to be written. The second stage operation is similar to the first embodiment, differing in that when the state 0 is to be written, the writing current can be lower than 13 because the cell has been reset to state 0 regardless of the initial state. The second embodiment ensures the accuracy of the written data while consuming longer writing time than the first embodiment.

When a read operation is performed on the phase change memory cell 300 to determine the data stored therein, reading current is fed through the first and second recording layer $32_1$ and $32_2$ and the resistance value between the first and second electrodes $31_1$ and $31_2$ is measured. The magnitude of the reading current is kept low enough not to change the phase of the recording layers. When the resistance value is $R(0)=R_{L1}+R_{L2}$, $R(1)=R_{H1}+R_{L2}$, and $R(2)=R_{H1}+R_{H2}$, the phase change memory cell 300 stores respectively state 0, state 1 and state 2.

Figure 8:
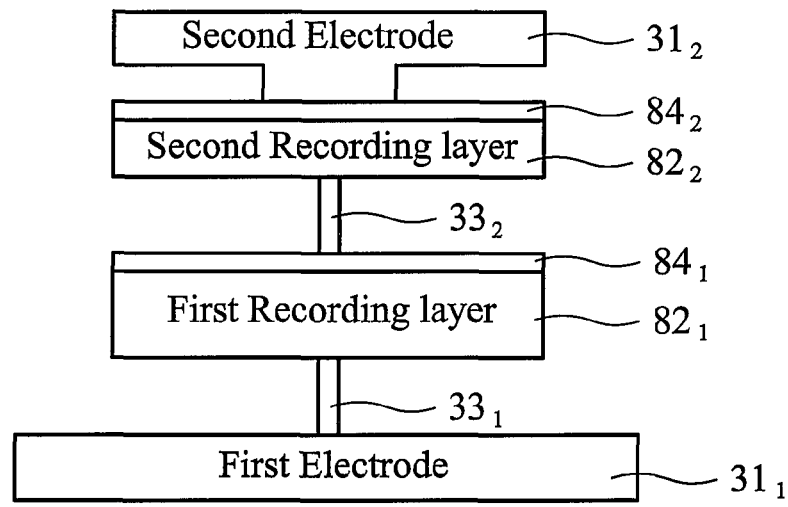
FIG. 8 is a cross section of a phase change memory cell in accordance with another embodiment of the invention.

FIG. 8 is a cross section of a phase change memory cell 800 in accordance with another embodiment of the invention, differing from the phase change memory cell 300 only in that the first recording layer $82_1$ and the second recording layer $82_2$ have different thicknesses (respectively denoted as PT1 and PT2) while having the same the top-view areas (that is, the diameters or edge lengths under a top-view of recording layers $82_1$ and $82_2$ in the memory cell 800). Reference numbers $84_1$ and $84_2$ respectively represent first and second blocking layers. The embodiment shown comprises PT1 larger than PT2, but PT1 can also be smaller than PT2. Similarly, the materials-of the first and second recording layers $82_1$ and $82_2$ can be the same or different. The embodiment uses the former to simplify the description.

Figure 9:
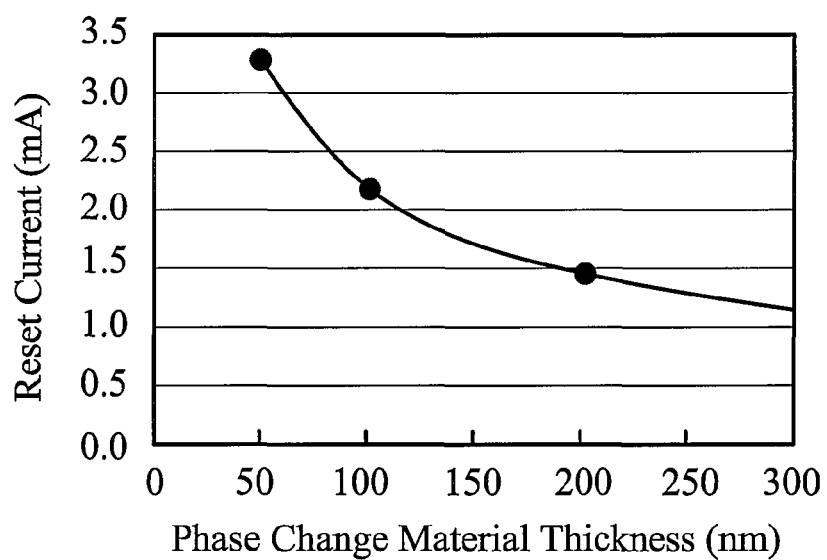
FIG. 9 shows relationship between reset current and thickness of a phase change recording layer.

FIG. 9 shows relationship of reset current with the thickness of a phase change material proposed by Samsung corporation in IEDM 2003, illustrating programming mechanism of the phase change memory cell 800 of the invention. As shown, phase change materials with different thicknesses have different magnitudes of reset current. Thus, even though the first and second recording layers $82_1$ and $82_2$ are the same material and fed with the same writing current, the active regions of them can have different phases.

Figure 10:
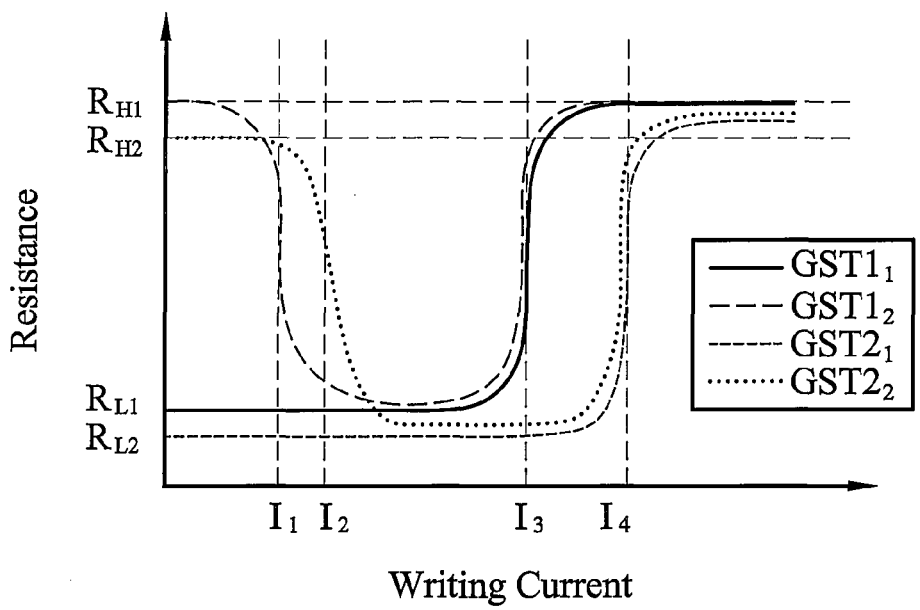
FIG. 10 shows respective programming curves for first and second recording layers of FIG. 8, illustrating the relationship between resistance values and writing current.

FIG. 10 shows respective programming curves for the first and second recording layers $82_1$ and $82_2$ of FIG. 8, illustrating the relationship between resistance values and writing current. In the figure, curves $GST1_1$ and $GST1_2$ respectively represent programming curves of the first recording layers $82_1$ with the initial phase in crystalline and amorphous states, and curves $GST2_1$ and $GST2_2$ respectively represent programming curves of the second recording layers $82_2$ with the initial phase in crystalline and amorphous states. As shown, the first and second recording layers $82_1$ and $82_2$ have resistance values $R_{L1}$ and $R_{L2}$ respectively in crystalline state and $R_{H1}$ and $R_{H2}$ respectively in amorphous state. As shown in FIG. 9, because the thickness of the first recording layer $82_1$ is higher than that of the second recording layer $82_2$, the reset current $I_3$ of the first recording layer $82_1$ is lower than the reset current $I_4$ of the second recording layer $82_2$. The figure is similar to FIG. 5 and the description is thus omitted for brevity.

Figure 11:
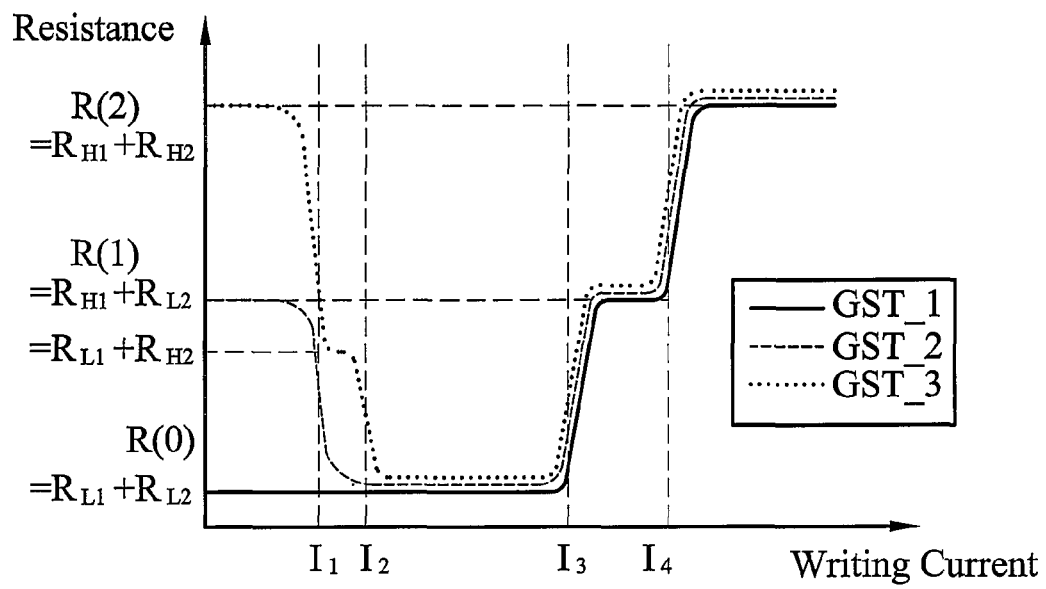
FIG. 11 shows programming curves for phase change memory cell of FIG. 8, illustrating the relationship between resistance values and writing current.

FIG. 11 shows programming curves for the phase change memory cell 800 of FIG. 8, illustrating the relationship between resistance values and writing current. In the figure, curves GST_1, GST_2 and GST_3 are respectively programming curves with the first and second recording layers $82_1$ and $82_2$ both in crystalline state (denoted as state 0), respectively in amorphous and crystalline states (denoted as state 1) and both in amorphous state (denoted as state 2) after the previous writing operation. As shown, writing currents in intervals between $I_2$ and $I_3$, between $I_3$ and $I_4$, and beyond $I_4$ correspond respectively to diverse resistance values $R(0)=R_{L1}+R_{L2}$, $R(1)=R_{H1}+R_{L2}$, and $R(2)=R_{H1}+R_{H2}$. The figure is similar to FIG. 6 and the description is thus omitted for brevity.

Accordingly, write operation is performed on the phase change memory cell 800 by feeding writing current through the first and second recording layers $82_1$ and $82_2$, wherein the magnitude of the writing current is determined according to which of the states 0-2 is to be written. Embodiments of writing currents corresponding to written states can also be referenced in FIGS. 7A and 7B. Similarly, when a read operation is performed on the phase change memory cell 800 to determine the data stored therein, reading current of appropriate magnitude is fed through the first and second recording layer $82_1$ and $82_2$ and the resistance value between the first and second electrodes $31_1$ and $31_2$ is measured.

It is noted that, the embodiments shown in FIGS. 3 and 8 respectively, the first and second recording layers have different top-view areas and thicknesses. The two embodiments, however, can be combined. That is, the first and second recording layers differ in not only top-view area but also thickness. In summary, the first and second recording layers have different "dimensions" such that different combinations of the crystalline and amorphous resistance are generated with different writing currents.

Figure 12:
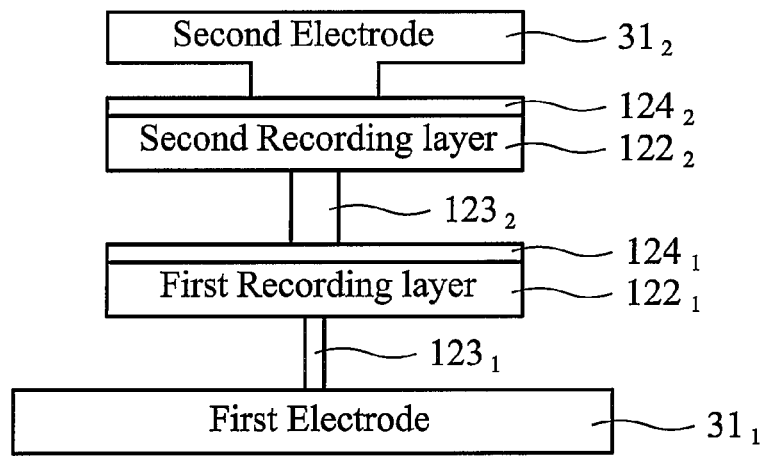
FIG. 12 is a cross section of a phase change memory cell in accordance with another embodiment of the invention.

FIG. 12 is a cross section of a phase change memory cell 1200 in accordance with another embodiment of the invention, differing from the phase change memory cell 300 only in that the first recording layer $122_1$ and the second recording layer $122_2$ have the same dimensions (in both thicknesses and top-view areas). Furthermore, the contact area between the first heating plug $123_1$ and the first recording layer $122_1$ (denoted as VA1) and the contact area between the second heating plug $123_2$ and the second recording layer $122_2$ (denoted as VA2) are different. Reference numbers $124_1$ and $124_2$ respectively represent first and second blocking layers. The embodiment shown comprises VA1 smaller than VA2, but VA1 can also be larger than VA2.

Figure 13:
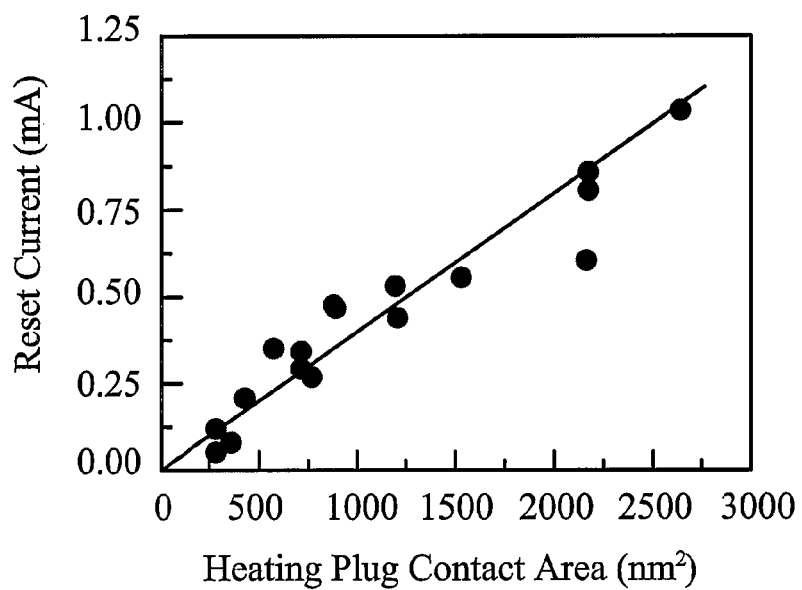
FIG. 13 shows relationship between reset current and contact area between heating plug and phase change recording layer.

FIG. 13 shows relationship between reset current and the contact area of heating plugs of a phase change material proposed by Samsung corporation in IEDM 2003, illustrating programming mechanism of the phase change memory cell 1200 of the invention. As shown, phase change materials with different contact areas of heating plugs have different magnitudes of reset current. Thus, even though the first and second recording layers $122_1$ and $122_2$ are the same material and fed with the same writing current, the active regions thereof can have different phases.

Figure 14:
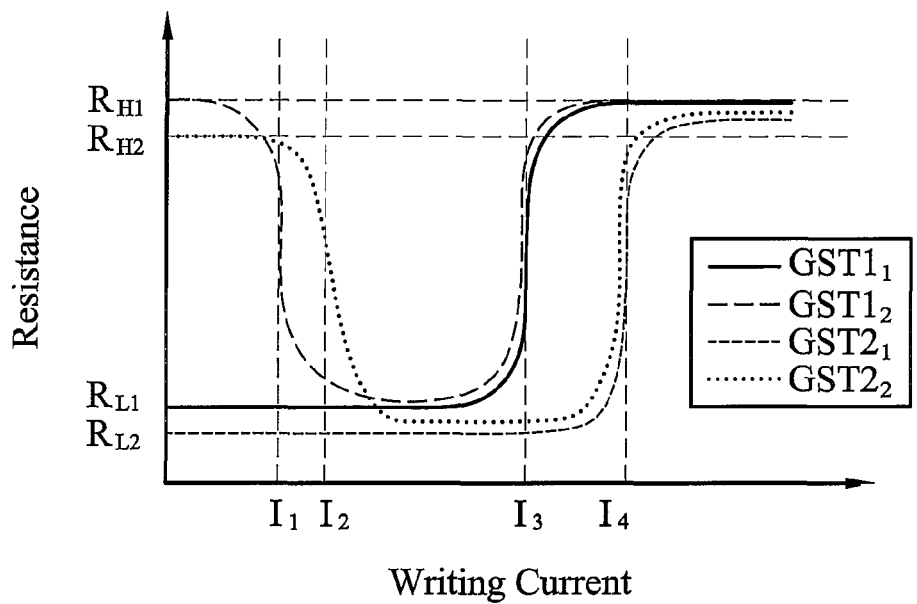
FIG. 14 shows respective programming curves for first and second recording layers in FIG. 12, illustrating the relationship between resistance values and writing current.

FIG. 14 shows respective programming curves for the first and second recording layers $122_1$ and $122_2$ of FIG. 12, illustrating the relationship between resistance values and writing current. In the figure, curves $GST1_1$ and $GST1_2$ respectively represent programming curves of the first recording layers $122_1$ with the initial phase in crystalline and amorphous states, and curves $GST2_1$ and $GST2_2$ respectively represent programming curves of the second recording layers $122_2$ with the initial phase in crystalline and amorphous states. As shown, the first and second recording layers $122_1$ and $122_2$ have resistance values $R_{L1}$ and $R_{L2}$ respectively in crystalline state and $R_{H1}$ and $R_{H2}$ respectively in amorphous state. As shown in FIG. 13, because VA1 is smaller than VA2, the reset current $I_3$ of the first recording layer $122_1$ is lower than the reset current $I_4$ of the second recording layer $122_2$. The figure is similar to FIG. 5 and the description is thus omitted for brevity.

Figure 15:
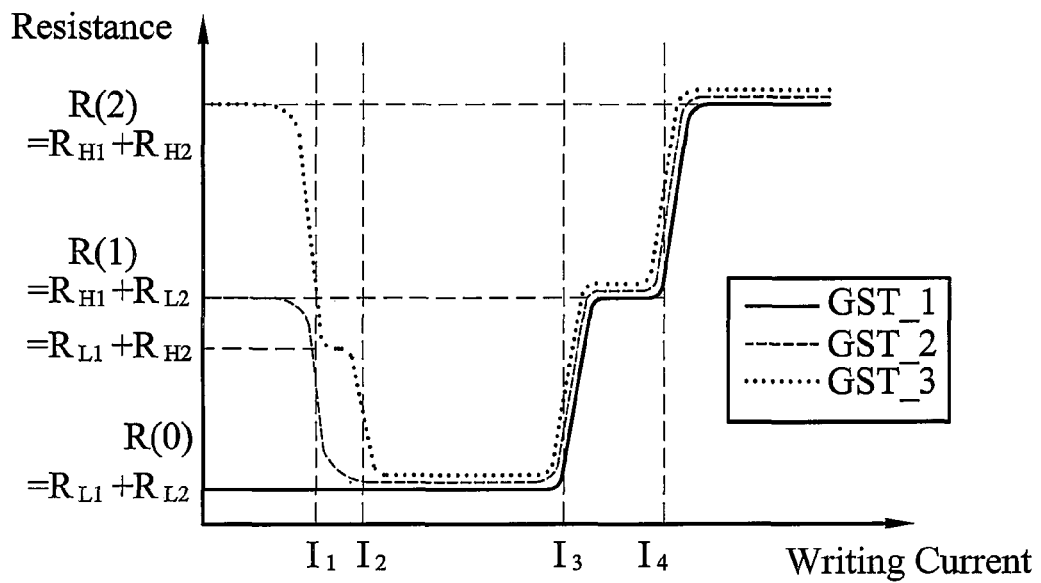
FIG. 15 shows programming curves for the phase change memory cell of FIG. 12, illustrating the relationship between resistance values and writing current.

FIG. 15 shows programming curves for the phase change memory cell 1200 of FIG. 12, illustrating the relationship between resistance values and writing current. In the figure, curves GST_1, GST_2 and GST_3 are respectively programming curves with the first and second recording layers $122_1$ and $122_2$ both in crystalline state (denoted as state 0), respectively in amorphous and crystalline states (denoted as state 1) and both in amorphous state (denoted as state 2) after the previous writing operation. As shown, writing currents in intervals between $I_2$ and $I_3$, between $I_3$ and $I_4$, and beyond $I_4$ correspond respectively to diverse resistance values $R(0)=R_{L1}+R_{L2}$, $R(1)=R_{H1}+R_{L2}$, and $R(2)=R_{H1}+R_{H2}$. The figure is similar to FIG. 6 and the description is thus omitted for brevity.

Accordingly, write operation is performed on the phase change memory cell 1200 by feeding writing current through the first and second recording layers $122_1$ and $122_2$, wherein the magnitude of the writing current is determined according to which of the states 0-2 is to be written. Embodiments of writing currents corresponding to written states can also be referenced in FIGS. 7A and 7B. Similarly, when a read operation is performed on the phase change memory cell 1200 to determine the data stored therein, reading current of appropriate magnitude is fed through the first and second recording layer $122_1$ and $122_2$ and the resistance value between the first and second electrodes $31_1$ and $31_2$ is measured.

Figure 16:
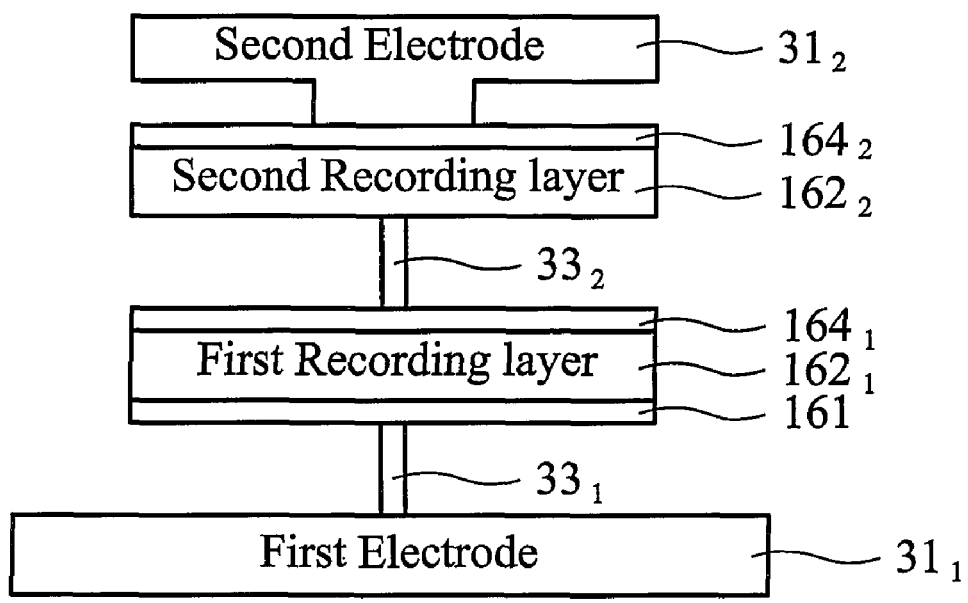
FIG. 16 is a cross section of a phase change memory cell in accordance with another embodiment of the invention.

FIG. 16 is a cross section of a phase change memory cell 1600 in accordance with another embodiment of the invention, differing from the phase change memory cell 300 only in that the first recording layer $162_1$ and the second recording layer $162_2$ have the same dimensions (in both thicknesses and top-view areas). Furthermore, an interlayer 161 is inserted between the first heating plug $33_1$ and the first recording layer $162_1$. Preferably, the material of the interlayer 161 is metal, semimetal or semiconductor with low thermal conductivity and high resistivity, such as TiN, TiAlN, TiW and SiC, to improve heating effect of writing current on the first recording layer $162_1$. Reference numbers $164_1$ and $164_2$ respectively represent first and second blocking layers. The embodiment shown comprises the interlayer 161 disposed between the first heating plug $33_1$ and the first recording layer $162_1$, but the interlayer 161 can also be disposed between the second heating plug $33_2$ and the second recording layer $162_2$. Additionally, the interlayer 161 is not required to cover the entire bottom surface of the first recording layer $162_1$, only to cover a partial area of the contact area of the first recording layer $162_1$ with the first heating plug $33_1$.

Figure 17:
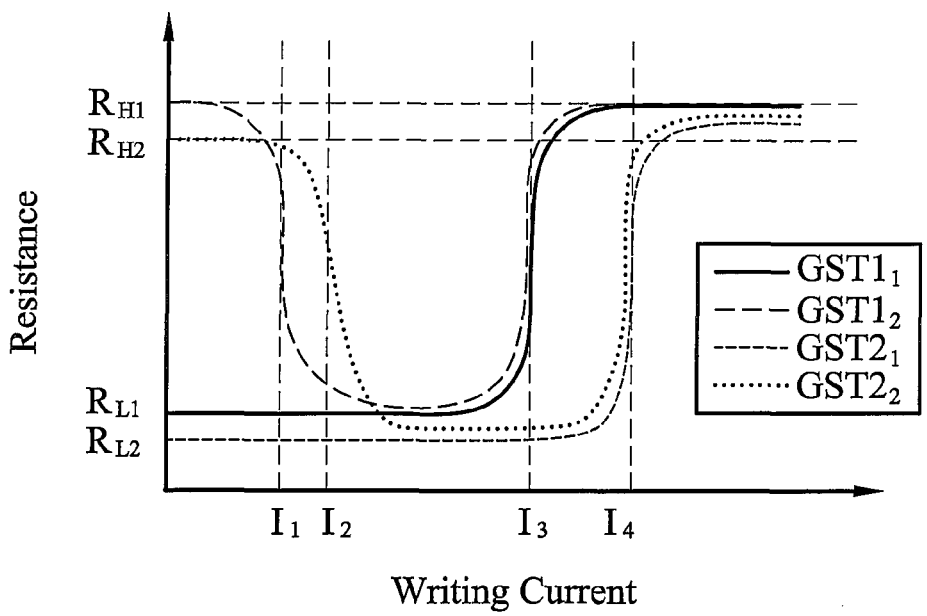
FIG. 17 shows respective programming curves for first and second recording layers in FIG. 16, illustrating the relationship between resistance values and writing current.

FIG. 17 shows respective programming curves for the first and second recording layers $162_1$ and $162_2$ of FIG. 16, illustrating the relationship between resistance values and writing current. In the figure, curves $GST1_1$ and $GST1_2$ respectively represent programming curves of the first recording layers $162_1$ with the initial phase in crystalline and amorphous states, and curves $GST2_1$ and $GST2_2$ respectively represent programming curves of the second recording layers $162_2$ with the initial phase in crystalline and amorphous states. As shown, the first and second recording layers $162_1$ and $162_2$ have resistance values $R_{L1}$ and $R_{L2}$ respectively in crystalline states and $R_{H1}$ and $R_{H2}$ respectively in amorphous states. Because the first recording layer $162_1$ is close to the interlayer 161, the heating effect of the writing current on the first recording layer $162_1$ is thus better than that on the second recording layer $162_2$, and the temperature increase of an active area of the first recording layer $162_1$ accordingly exceeds that of the second recording layer $162_2$, the reset current $I_3$ of the first recording layer $162_1$ is lower than the reset current $I_4$ of the second recording layer $162_2$. The figure is similar to FIG. 5 and the description is thus omitted for brevity.

Figure 18:
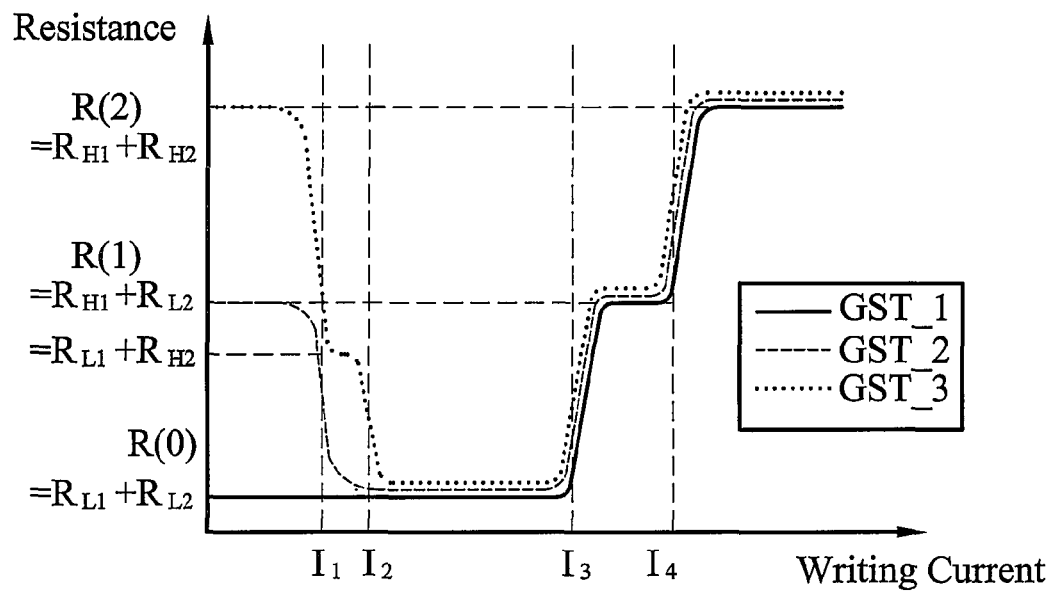
FIG. 18 shows programming curves for the phase change memory cell of FIG. 16, illustrating the relationship between resistance values and writing current.
Figure 19:
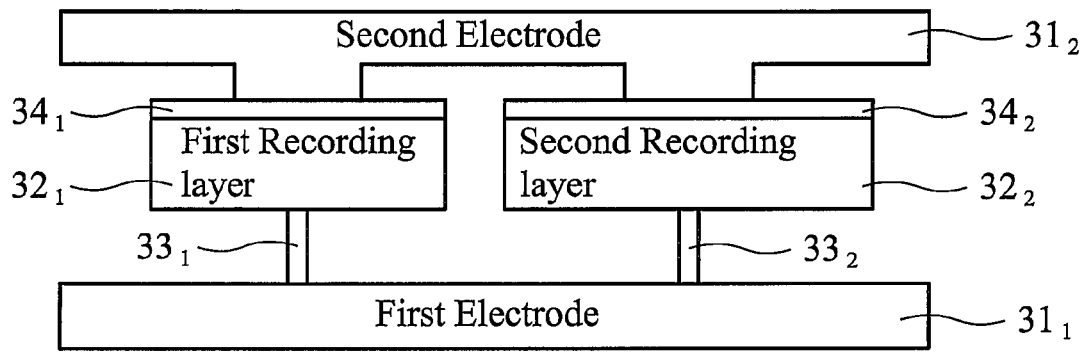
FIG. 19 is a cross section of a phase change memory cell in accordance with another embodiment of the invention.
Figure 20:
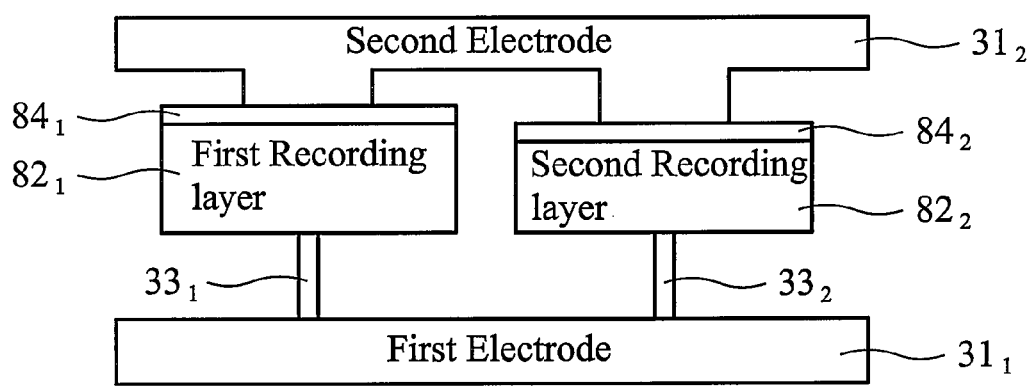
FIG. 20 is a cross section of a phase change memory cell in accordance with another embodiment of the invention.
Figure 21:
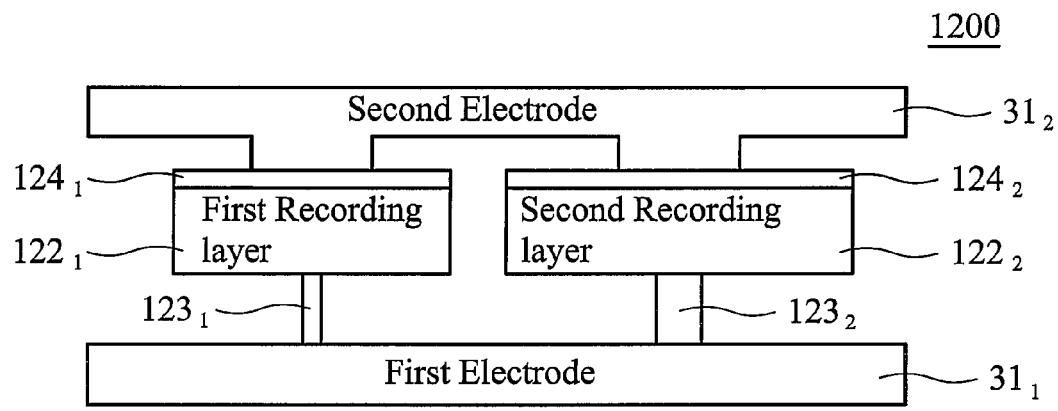
FIG. 21 is a cross section of a phase change memory cell in accordance with another embodiment of the invention.
Figure 22:
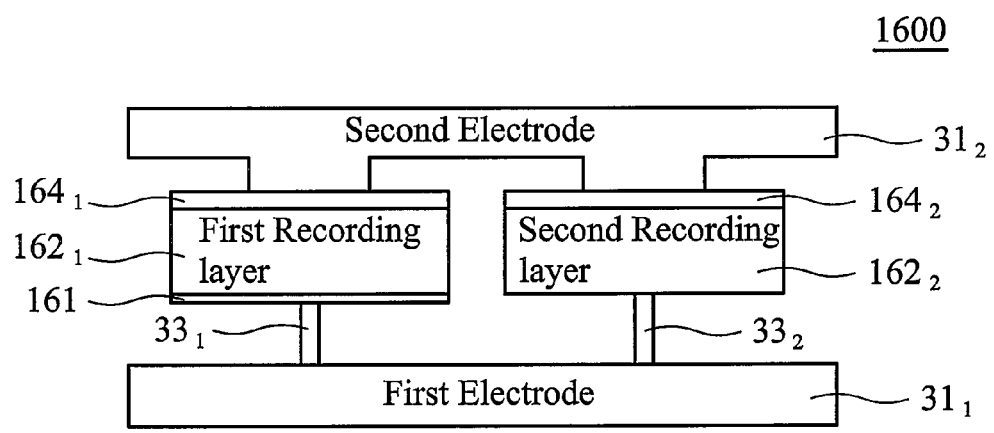
FIG. 22 is a cross section of a phase change memory cell in accordance with another embodiment of the invention.

FIG. 18 shows programming curves for the phase change memory cell 1600 of FIG. 16, illustrating the relationship between resistance values and writing current. In the figure, curves GST_1, GST_2 and GST_3 are respectively programming curves with the first and second recording layers $162_1$ and $162_2$ both in crystalline state (denoted as state 0), respectively in amorphous and crystalline states (denoted as state 1) and both in amorphous state (denoted as state 2) after the previous writing operation. As shown, writing currents in intervals between $I_2$ and $I_3$, between $I_3$ and $I_4$, and beyond $I_4$ correspond respectively to diverse resistance values $R(0)=R_{L1}+R_{L2}$, $R(1)=R_{H1}+R_{L2}$, and $R(2)=R_{H1}+R_{H2}$. The figure is similar to FIG. 6 and the description is thus omitted for brevity.

Accordingly, write operation is performed on the phase change memory cell 1600 by feeding writing current through the first and second recording layers $162_1$ and $162_2$, wherein the magnitude of the writing current is determined according to which of the states 0-2 is to be written. Embodiments of writing currents corresponding to written states can also be referenced in FIGS. 7A and 7B. Similarly, when a read operation is performed on the phase change memory cell 1600 to determine the data stored therein, reading current of appropriate magnitude is fed through the first and second recording layer $162_1$ and $162_2$ and the resistance value between the first and second electrodes $31_1$ and $31_2$ is measured.

The first and second recording layers are connected in series in FIGS. 3, 8, 12 and 16. The invention, however, is not limited thereto, and the first and second recording layers can be connected in parallel as shown in FIGS. 19, 20, 21 and 22. As such, resistance corresponding to states 0 to 2 are respectively $R(0)=(R_{L1} \cdot R_{L2})/(R_{L1}+R_{L2})$, $R(1)=(R_{H1} \cdot R_{L2})/(R_{H1}+R_{L2})$, and $R(2)=(R_{H1} \cdot R_{H2})/(R_{H1}+R_{H2})$. Similarly, when a write operation is performed, the magnitude of the writing current is determined according to which of the states 0-2 is to be written. When a read operation is performed to determine the stored state, a reading current of appropriate magnitude is fed through the first and second recording layer $162_1$ and $162_2$ and the resistance value between the first and second electrodes $31_1$ and $31_2$ is measured.

It is noted that the embodiments can be combined as required. For example, in an embodiment, the first and second recording layers differ not only in dimensions, but also in the contact areas respectively with the first and second heating plugs. Additionally, although the embodiments all have two recording layers and provide three-level operations, the phase change memory cell of the invention can be realized with more than two recording layers and/or provision of more-than-three level operation. When a phase change memory cell has more than three recording layers, the recording layers are not required to have only a series or parallel connection, but can have combinations of series and parallel connections, such as one recording layer connected in parallel with other two recording layers connected in series.

The invention increases memory cell density since not only multilevel operation is achieved but also recording layers can be stacked perpendicularly between the first and second electrode thereby not occupying excess area. Furthermore, the invention can be implemented with a single phase change material of the recording layers, so fabrication process is simpler and process compatibility is better than in the conventional phase change memories implemented with various phase change materials. The invention can be realized by currently developed semiconductor fabrication process technologies. Furthermore, the invention has better controllability in multilevel operation, since programming current can be readily adjusted through structural parameters of recording layers, heating plugs and interlayer(s), operation characteristics of only one recording layer can be considered, and operation between different states is easily controlled due to sufficiently large current programming intervals corresponding to different states.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A phase change memory cell, comprising:
a first electrode and a second electrode, wherein the first electrode is a single metallic or alloy layer or a metallic compound;
a first recording layer disposed between the first and second electrodes;
a second recording layer disposed between the first and second electrodes and over the first recording layer;
a first heating plug disposed between the first recording layer and the first electrode and contacting the first recording layer; and
a second heating plug disposed between the first recording layer and the second recording layer and contacting the second recording layer, wherein:
the second heating plug has a total top-view area smaller than a total top-view area of the second recording layer;
the first heating plug and the second heating plug allow flowing a programming current through the first recording layer and the second recording layer; and
a total contact area between the first heating plug and the first recording layer is smaller than a total contact area between the second heating plug and the second recording layer, wherein the total contact area between the first heating plug and the first recording layer is a portion of a bottom surface of the first recording layer.

2. The phase change memory cell of claim 1, wherein the recording layers are formed of the same material.

3. The phase change memory cell of claim 1, further comprising:
a first blocking layer disposed on the first recording layer; and
a second blocking layer disposed on the second recording layer so as to be between the second recording layer and the second electrode.

4. The phase change memory cell of claim 3, wherein the first and second blocking layers are metallic or alloy layers or metallic compounds.

5. A phase change memory cell, comprising:
a first electrode and a second electrode, wherein the first electrode is a single metallic or alloy layer or a metallic compound;
a first recording layer disposed between the first and second electrodes;
a second recording layer disposed between the first and second electrodes and over the first recording layer;
a first heating plug disposed between the first recording layer and the first electrode and contacting the first recording layer; and
a second heating plug disposed between the first recording layer and the second recording layer and contacting the second recording layer,
wherein:
a total contact surface between the second heating plug and the second recording layer is smaller than a bottom surface of the second recording layer;
the first heating plug and the second heating plug allow flowing a programming current through the first recording layer and the second recording layer; and
a total contact area between the first heating plug and the first recording layer is smaller than a total contact area between the second heating plug and the second recording layer, wherein the total contact area between the first heating plug and the first recording layer is a portion of a bottom surface of the first recording layer.

6. The phase change memory cell of claim 5, wherein the recording layers are formed of the same material.

7. The phase change memory cell of claim 5, further comprising:
a first blocking layer disposed on the first recording layer; and
a second blocking layer disposed on the second recording layer so as to be between the second recording layer and the second electrode.

8. The phase change memory cell of claim 7, wherein the first and second blocking layers are metallic or alloy layers or metallic compounds.

* * * * *